United States Patent
Rhee et al.

(10) Patent No.: US 7,047,474 B2
(45) Date of Patent: May 16, 2006

(54) DECODING CONCATENATED CODES VIA PARITY BIT RECYCLING

(76) Inventors: Do-Jun Rhee, 520-805 Samsung APT, Jinsan-Maul, 1168 Poongdukcheon-Ri, Susi-Eup, Yongin-City, Gyeonggi-Do (KR); Masaki Sato, 715-501 Dongah APT, Salgu-Gol, 988-2 Yeongtong-Dong, Paldal-Gu, Suwon-City, Gyeonggi-Do (KR)

( * ) Notice: Subject to any disclaimer, the term of this patent is extended or adjusted under 35 U.S.C. 154(b) by 534 days.

(21) Appl. No.: 10/325,833

(22) Filed: Dec. 23, 2002

(65) Prior Publication Data
US 2004/0123217 A1   Jun. 24, 2004

(51) Int. Cl.
*H03M 13/00* (2006.01)
(52) U.S. Cl. .................... 714/755; 714/786
(58) Field of Classification Search .............. 714/755, 714/786, 758, 776, 784, 795, 792, 800; 374/341
See application file for complete search history.

(56) References Cited

U.S. PATENT DOCUMENTS

| | | | | |
|---|---|---|---|---|
| 5,457,704 A | * | 10/1995 | Hoeher et al. | 714/794 |
| 5,875,199 A | * | 2/1999 | Luthi | 714/780 |
| 5,983,383 A | | 11/1999 | Wolf | |
| 6,606,724 B1 | * | 8/2003 | Krieger et al. | 714/755 |
| 6,810,502 B1 | * | 10/2004 | Eidson et al. | 714/786 |
| 2001/0025358 A1 | | 9/2001 | Eidson et al. | |

FOREIGN PATENT DOCUMENTS

KR   2000-0070288   11/2000

* cited by examiner

*Primary Examiner*—Phung My Chung
(74) *Attorney, Agent, or Firm*—Harness, Dickey & Pierce

(57) ABSTRACT

A method, apparatus and article of manufacture for decoding concatenated codes includes (in terms of the method): receiving data representing concatenated codes; first inner decoding the received data resulting in first inner message data and parity data; first outer decoding the first inner message data, resulting in reliability information and first outer message data; second inner decoding the first outer message data, resulting in second inner message data; and second outer decoding the second inner message data. The second inner decoding is a function of: the reliability information from the first outer decoding; the first outer message data; and the parity data from the first inner decoding.

22 Claims, 11 Drawing Sheets

FIG. 5

*RELIABILITY INFORMATION USAGE FOR BRANCH METRIC CALCULATION IN THE SECOND TCM DECODER

| CASE | UNCORRECTABLE PACKET "P" | CORRECTED SYMBOL "S" | RELIABILITY OF FIRST R-S DECODED MESSAGE DATA | RELIABILITY OF PARITY DATA FROM FIRST TCM DECODER |
|---|---|---|---|---|
| CASE 1 | YES | – | MIDDLE | MIDDLE |
| CASE 2 | NO | YES | HIGH | LOW |
| CASE 3 | NO | NO | HIGH | MIDDLE |

DECODING CONCATENATED CODES VIA PARITY BIT RECYCLING

BACKGROUND OF THE INVENTION

A concatenated code is a doubly-encoded type of code having an inner code and an outer code. The inner code encodes the outer code.

The inner code corrects most of the errors introduced by the communications channel and is typically a convolution code. The outer code corrects the majority of decoding errors (which typically are bursty) that occur during the first decoding. The Reed-Solomon (R-S) code is commonly used as the outer code.

FIG. 1 is a block diagram of a typical concatenated code system 100 according to the Background Art. The system 100 includes: an outer encoder 102; an optional interleaver 104; an inner encoder 106; a modulator 108; a communications channel 110; a demodulator 112; an inner decoder 114; an optional de-interleaver 116 (present if the interleaver 104 is present); and an outer decoder 118.

FIG. 2 is a block diagram of a concatenated code iterative decoder 200 according to the Background Art that is compliant with the Advanced Television Standards Committee (ATSC) 8-VSB (vestigial sidebands) standard. The decoder 200 includes: a first inner, trellis-coded modulation (TCM) decoder 202; an optional de-interleaver 204 (that itself has a symbol de-interleaver 206 and a convolutional de-interleaver 208); a first outer, R-S decoder 210; an optional interleaver 212 (that itself has a convolutional interleaver 214 and a symbol interleaver 216); an inner TCM encoder 218; a second inner TCM decoder 220; a second optional de-interleaver 222 (present if interleaver 212 is present) (the de-interleaver 222 including a symbol de-interleaver 224 and a convolutional de-interleaver 226); and a second outer R-S decoder 228.

The decoder 200 is designed to work with a channel exhibiting additive white Gaussian noise (AWGN). The ATSC standard for 8-VSB requires a decoder to successfully decode a signal that is received having a maximum segment error rate (SER) of $1.93 \times 10^{-4}$ at a minimum energy per symbol ($E_S/N_O$), or signal to noise ratio (SNR), of 14.9 dB.

The decoder 200 will decode a signal having an SNR of 14.9 or greater. For an SNR below 14.9 dB, the decoder 200 will fail to decode the received signal, yet such failure does not prevent the decoder 200 from being considered ATSC-compliant.

SUMMARY

An embodiment of the invention provides a method, apparatus and article of manufacture for decoding concatenated codes. Such a method includes: receiving data representing concatenated codes; first inner decoding the received data resulting in first inner message data and parity data; first outer decoding the first inner message data, resulting in reliability information and first outer message data; second inner decoding the first outer message data, resulting in second inner message data; and second outer decoding the second inner message data. The second inner decoding is a function of: the reliability information from the first outer decoding; the first outer message data; and the parity data from the first inner decoding.

Additional features and advantages of the invention will be more fully apparent from the following detailed description of example embodiments, the appended claims and the accompanying drawings.

BRIEF DESCRIPTION OF THE DRAWINGS

FIG. 5 is a Table representing a qualitative assessment information according to an embodiment of the invention.

Figure 1:
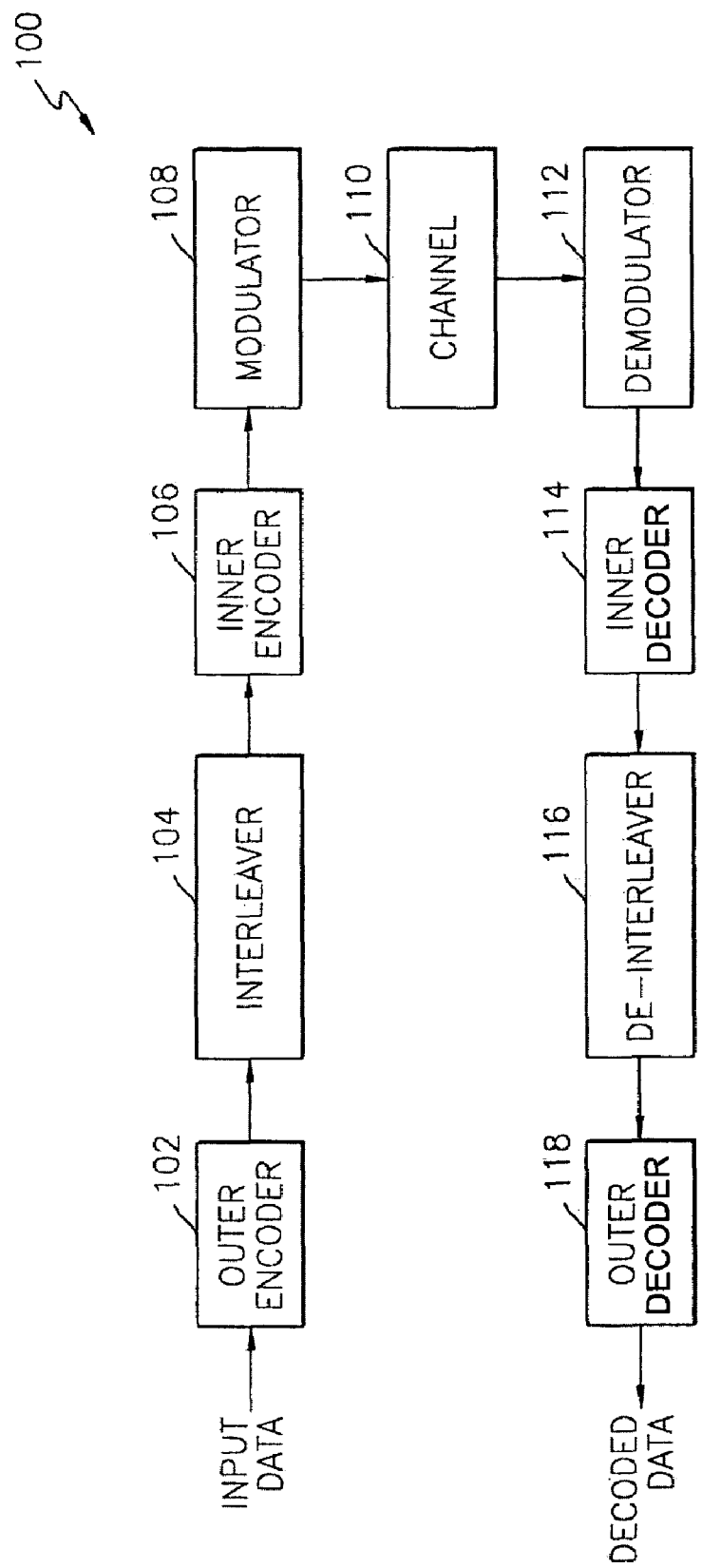
FIG. 1 is a block diagram of a typical concatenated code system according to the Background Art.
Figure 2:
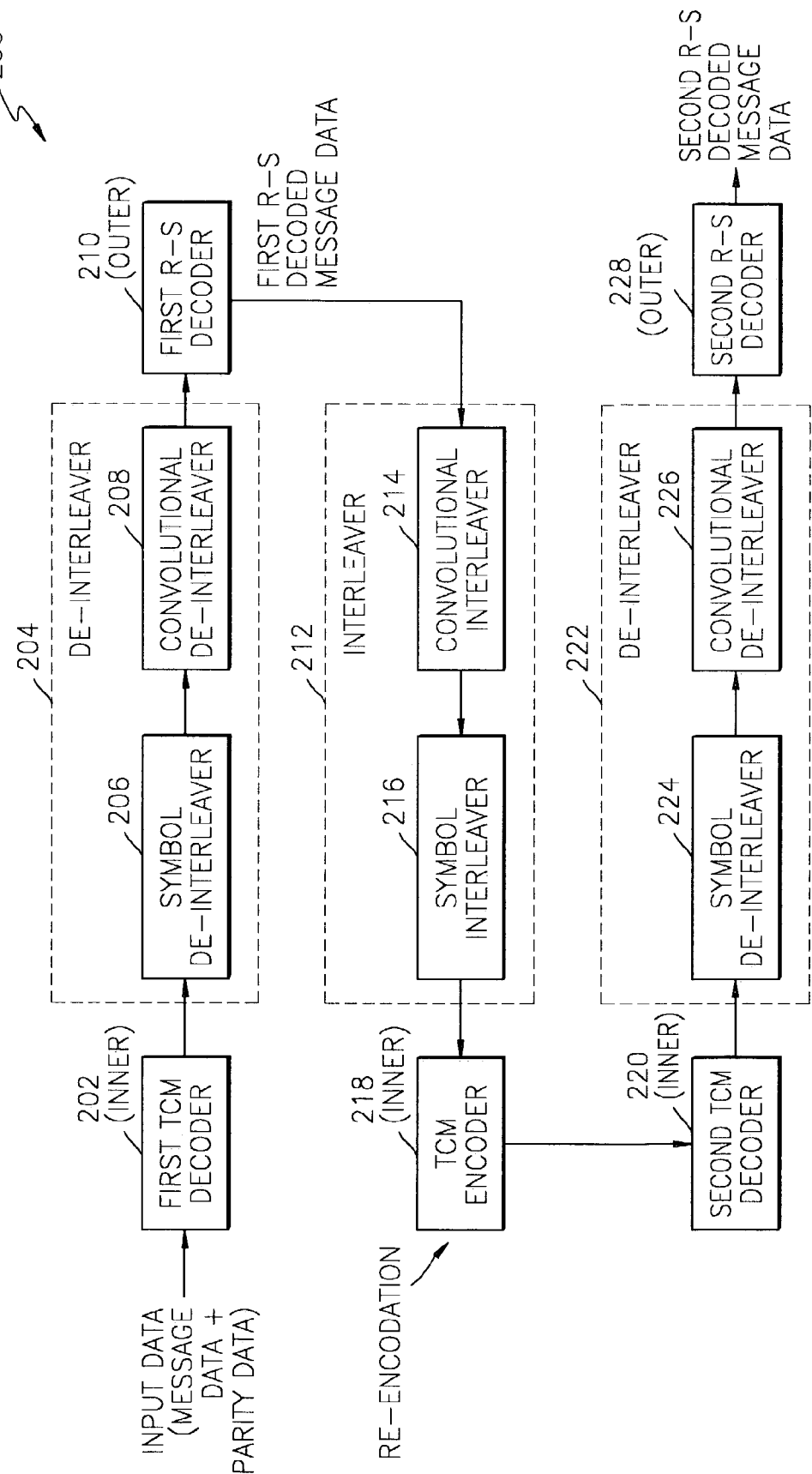
FIG. 2 is a block diagram of a concatenated code iterative decoder according to the Background Art.

Actions in a UML sequence diagram are depicted with arrows of different styles. A ──▶would indicate an action that expects a response action. A ◀── would indicate a response action. A ──▶would indicate an action for which the response is implied. And a ──▶would indicate an action for which no response is expected.

The accompanying drawings are: intended to depict example embodiments of the invention and should not be interpreted to limit the scope thereof; and not to be considered as drawn to scale unless explicitly noted.

BRIEF DETAILED DESCRIPTION OF EXAMPLE EMBODIMENTS

An embodiment of the invention represents a recognition of the following. Terrestrial broadcasting environments are really not AWGN channels. Rather, the received signals include the directly received version of the transmitted signal as well as reflections (indirectly received versions) of the transmitted signal. As a result, a signal that would arrive at a 14.9 dB level via an AWGN channel is more likely to arrive as a 14.6 dB signal in the real terrestrial broadcasting environments. This reduces an effective reception range of an 8-VSB decoder because, as noted above, the decoder 200 according to the Background Art will not decode a signal below 14.9 dB.

Another embodiment of the invention represents a recognition of the following. If there are errors in the first outer decoded message data from the first outer decoder 210, then parity data generated by the inner TCM encoder 218 (a re-encodation!) will have errors. And the second inner TCM decoder 220 cannot correct such errors.

Another embodiment of the invention represents a recognition that decoder performance, in terms of the minimum SNR signal that can be decoded, can be enhanced without necessarily changing the architecture of the encodation according to the Background.

Figure 3:
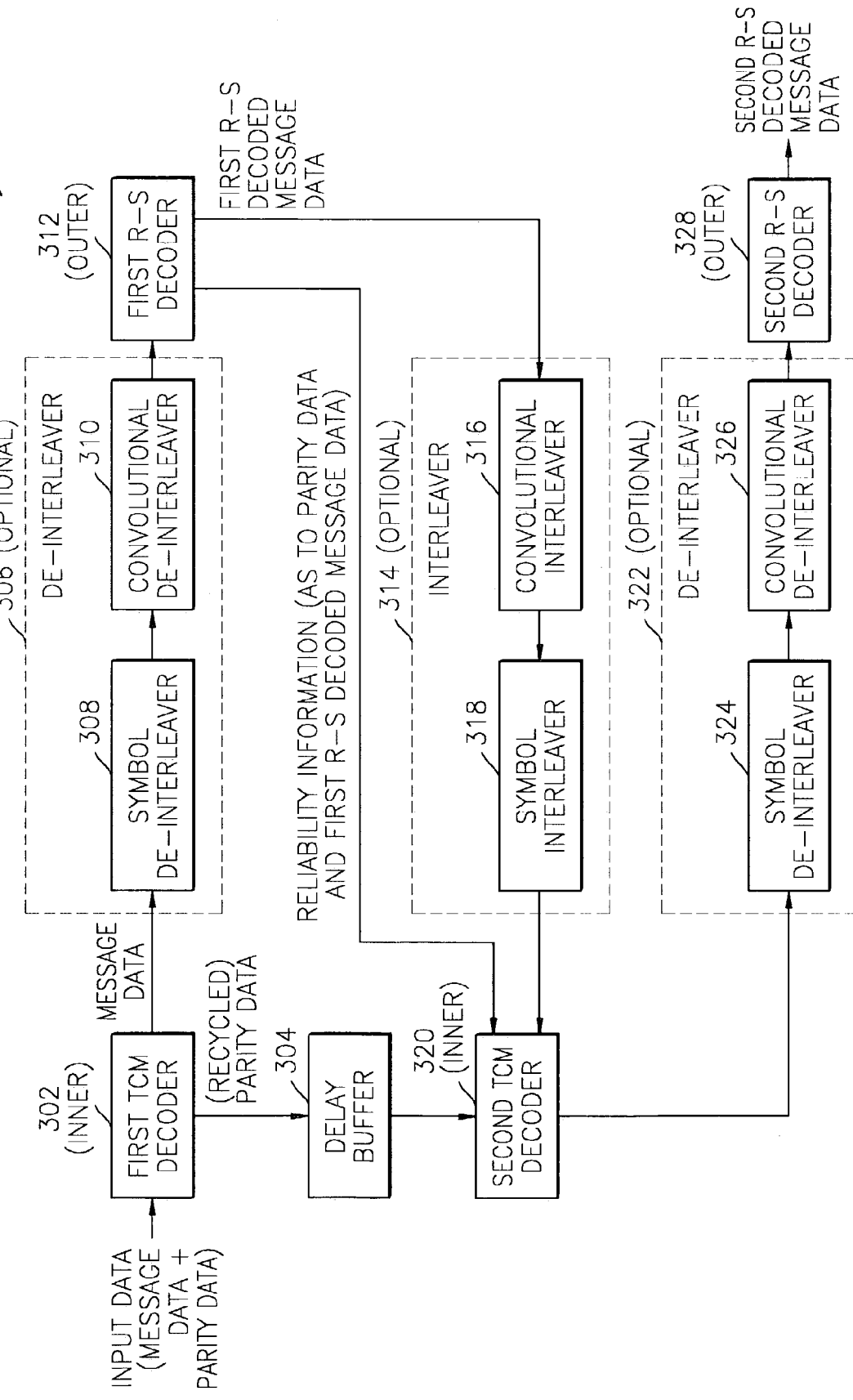
FIG. 3 is a block diagram of a concatenated code decoder according to an embodiment of the invention.

FIG. 3 is a block diagram of a concatenated code decoder 300 according to an embodiment of the invention. The decoder 300 includes: a first inner, e.g., TCM, decoder 302; a delay unit 304; an optional first de-interleaver 306 (that itself can include a first symbol de-interleaver 308 and a first convolutional de-interleaver 310); a first outer, e.g., R-S, decoder 312; an optional interleaver 314 (that itself can include a convolutional interleaver 316 and a symbol interleaver 318); a second inner, e.g., TCM, decoder 320; an optional second de-interleaver 322 (that itself can include a second symbol de-interleaver 324 and a second convolutional de-interleaver 326); and a second outer, e.g., R-S, decoder 328.

It is to be observed that parity data from the first inner decoder 302 is not discarded but instead is provided to the delay unit 304. After suitable delay, the delay unit 304 then provides the parity data (after suitable delay) to the second inner decoder 320. The delay unit 304 time-aligns the parity data to the first outer message data from the first outer decoder 312. In other words, a suitable delay by the delay unit 304 can compensate for the delay introduced by the R-S decoder 312 and (if present) the first de-interleaver 306, resulting in time re-alignment between the parity data and the first outer message data.

The second inner decoder 320 receives reliability information from the first outer decoder 312. Such reliability information concerns the reliability of the parity data from the first inner decoder 302 and the reliability of the first outer message data generated by the first outer decoder 312. Such reliability information can be a qualitative assessment (e.g., low, middle or high) as depicted in the Table of FIG. 5, to be discussed below.

In the first outer decoder 312, when the number of errors in the received packet is greater than the error correcting capability of the decoder 312 (e.g., more than 8 errors for 8-VSB), then the decoder 312 does not correct any of the errors in the packet. In this circumstance, the decoder 312 can generate a signal indicating that the corresponding packet is uncorrectable. But when the errors are not so great in number as to preclude correction, then the decoder 312 can generate a signal indicating corrected symbol error position via the generation of an error location polynomial.

Performance of the decoder 300 according to an embodiment of the invention is improved relative to the Background by inputting the parity data from the first inner decoder 302 and the reliability information from the first outer decoder 312, as well as the first outer message data from the first outer decoder 312. In contrast to the ability of the Background Art decoder 200 to be able to decode only a signal having an SNR of 14.9 dB or greater, the decoder 300 can decode a signal having at least a 14.6 dB (if not lower) SNR.

Figure 6:
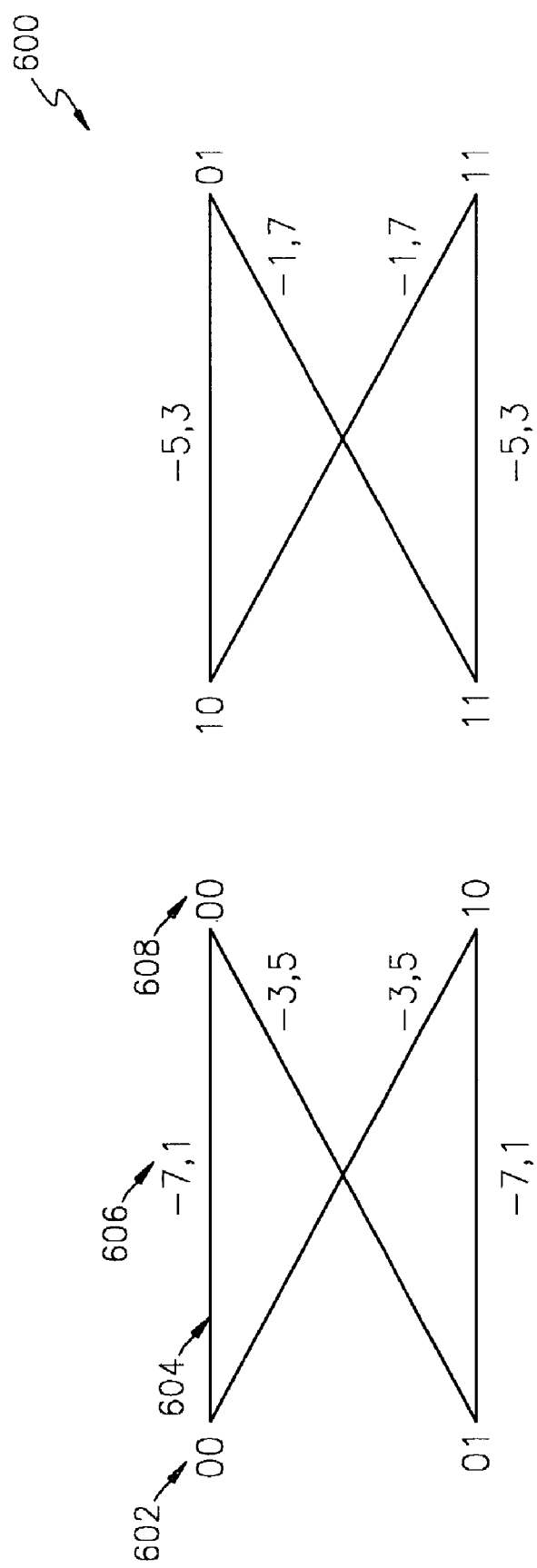
FIG. 6 is an example of a trellis diagram for inner decoders according to an embodiment of the invention.

FIG. 6 is an example of a trellis diagram 600 (here, 4-states are possible in two registers of an encoder) representing the algorithm of the encoders corresponding to the inner decoders 302 and 320. FIG. 6 shows transmitted data with states according to the encoding algorithm. There are many encoding algorithms, and thus many trellises, with which embodiments of the invention can be used. The particular trellis 600 is provided merely to further discussion and is not limiting.

Reference number 602 points to a starting state, namely, of the two registers of the encoder. There are four states of the trellis 600. Ref. no. 604 points to a transition from one state to another upon receiving new input data in the encoder. Ref. no. 608 points to an ending state reached during the transition 604. Ref. no. 606 points to the two possible output values resulting from the transition 604. For example, regarding the example of FIG. 6, when the corresponding encoder (not depicted) goes from state 00 to state 10, either −3 or 5 will be output, i.e., transmitted.

Decoding in the decoders 302/320, in general, can be done by selecting from among multiple branch metric candidate values for each possible branch in the trellis 600 relative to the inputted data (the received symbol currently under consideration), then performing an Add-Compare-Select (ACS) process, and then performing a Traceback process. The ACS and Traceback processes are known. But selecting from among multiple branch metric candidate values, etc., represents an embodiment of the invention. The branch metric values can be based upon the Euclidian distance in the case of soft data, or the Hamming distance in the case of hard data.

The parity data from the first inner decoder 302 and the first outer message data can be soft decision data in the sense that it has an 8-bit quantization, i.e., it is 8-bit data representing 0–255 levels.

Figure 7:
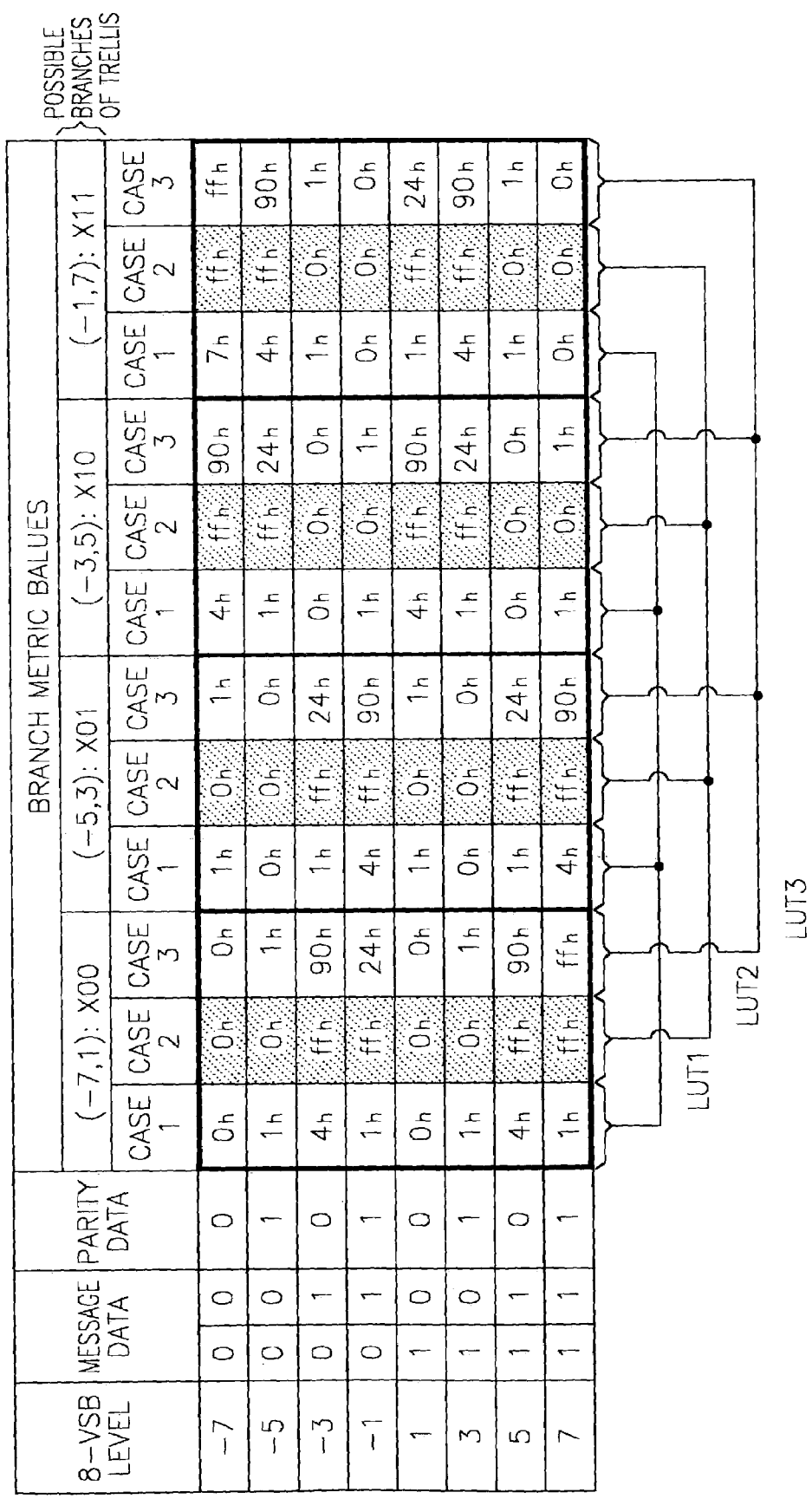
FIG. 7 is a Table of branch metric values according to an embodiment of the invention.

The branch metric values of the trellis 600 in the second inner decoder 320 can be weighted according to the reliability information from the first outer decoder 312 and the parity data from the first inner decoder 302. FIG. 7 is a Table depicting an example of such weightings. Values in the first column, "8-VSB level," represent the values that a received symbol can take. Such values correspond to the combination of the associated parity bit value and the values of the associated two bits of message data.

Under the heading branch metric values are groups of columns that list values in hexadecimal notation ($0_h=0_{10}, \ldots, \text{ff}_h=255_{10}$). Each group of columns corresponds to one of four transmitted data pairs, namely (−7, 1), (−5, 3), (−3, 5) and (−1, 7). Here, according to the example trellis of FIG. 6, there are 2 possible outputs that can be produced when traversing each branch, respectively. Within each group of columns is a column corresponding to Case1, Case2 and Case3. As such, a case is a set of data that can be accessed, e.g., via a look-up table (LUT).

Values in each case of the Table of FIG. 7 can be determined as follows. For each possible branch, each of the 8 possible VSB levels is evaluated. For a given one of the 8-VSB levels, the Euclidean distance from each of the two possible outputs to the given level is determined and the smaller of the two distances is selected and stored as the corresponding value in the column representing a portion of the case.

The branch metric values of the Case1 columns of FIG. 7 correspond to a situation in which the reliability of the first outer decoder 312 is qualitatively assessed as being "middle" and the reliability of the parity data from the first inner decoder 302 is "middle." Similar correspondences exist with the Case2 and Case3 columns.

Figure 4:
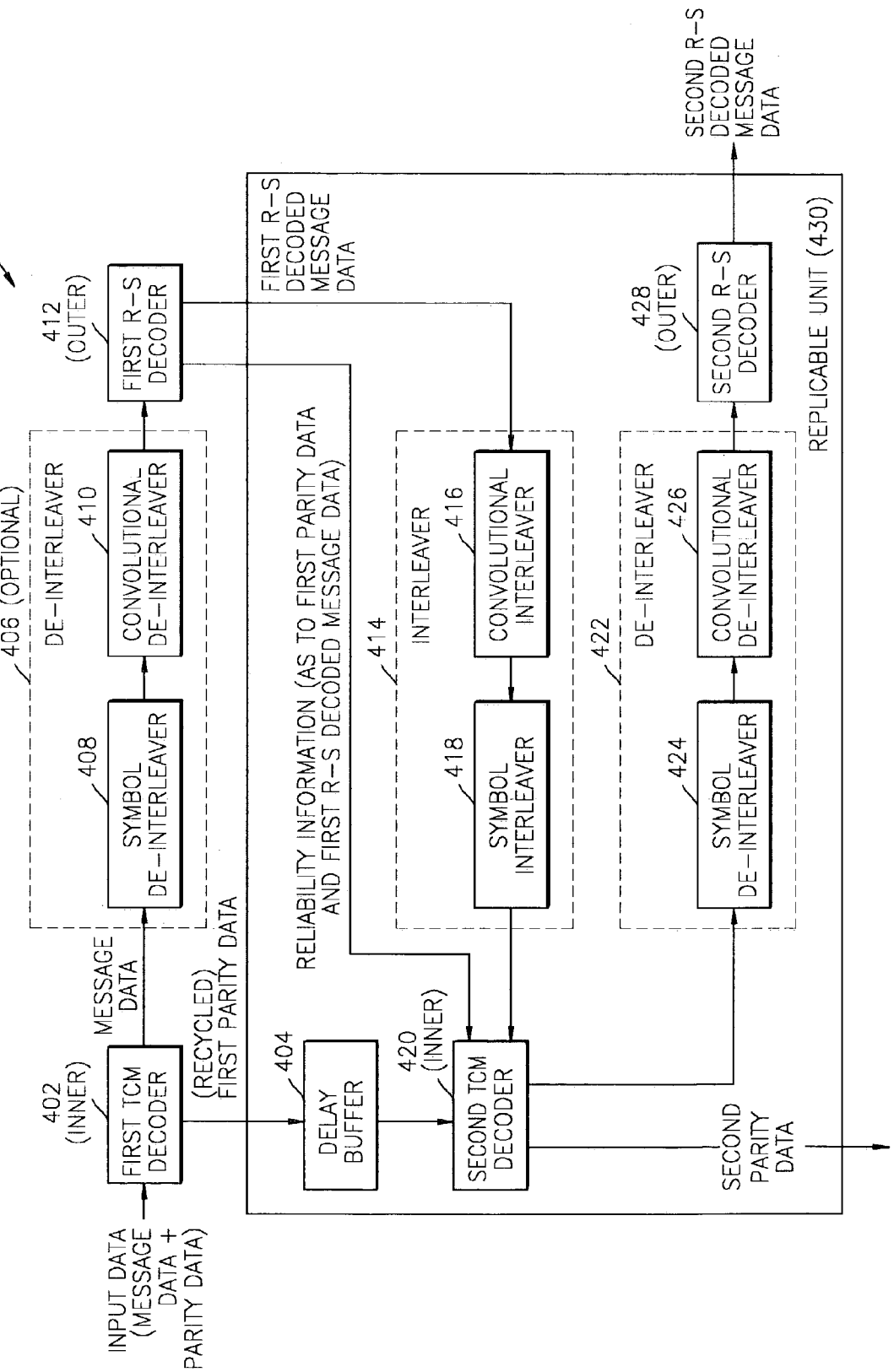
FIG. 4 is a block diagram of an iterative decoder of concatenated codes according to an embodiment of the invention.

FIG. 4 is a block diagram of an iterative decoder 400 for decoding concatenated codes according to an embodiment of the invention. The decoder 400 includes a first inner, e.g., TCM, decoder 402; a delay unit 404; an optional first de-interleaver 406 (that itself can include a first symbol de-interleaver 408 and a first convolutional de-interleaver 410); a first outer, e.g., R-S, decoder 412; an optional interleaver 414 (that itself can include a convolutional interleaver 416 and a symbol interleaver 418); a second inner,. e.g., TCM, decoder 420; an optional second de-interleaver 422 (that itself can include a second symbol de-interleaver 424 and a second convolutional de-interleaver 426); and a second outer, e.g., R-S, decoder 428.

Figure 8:
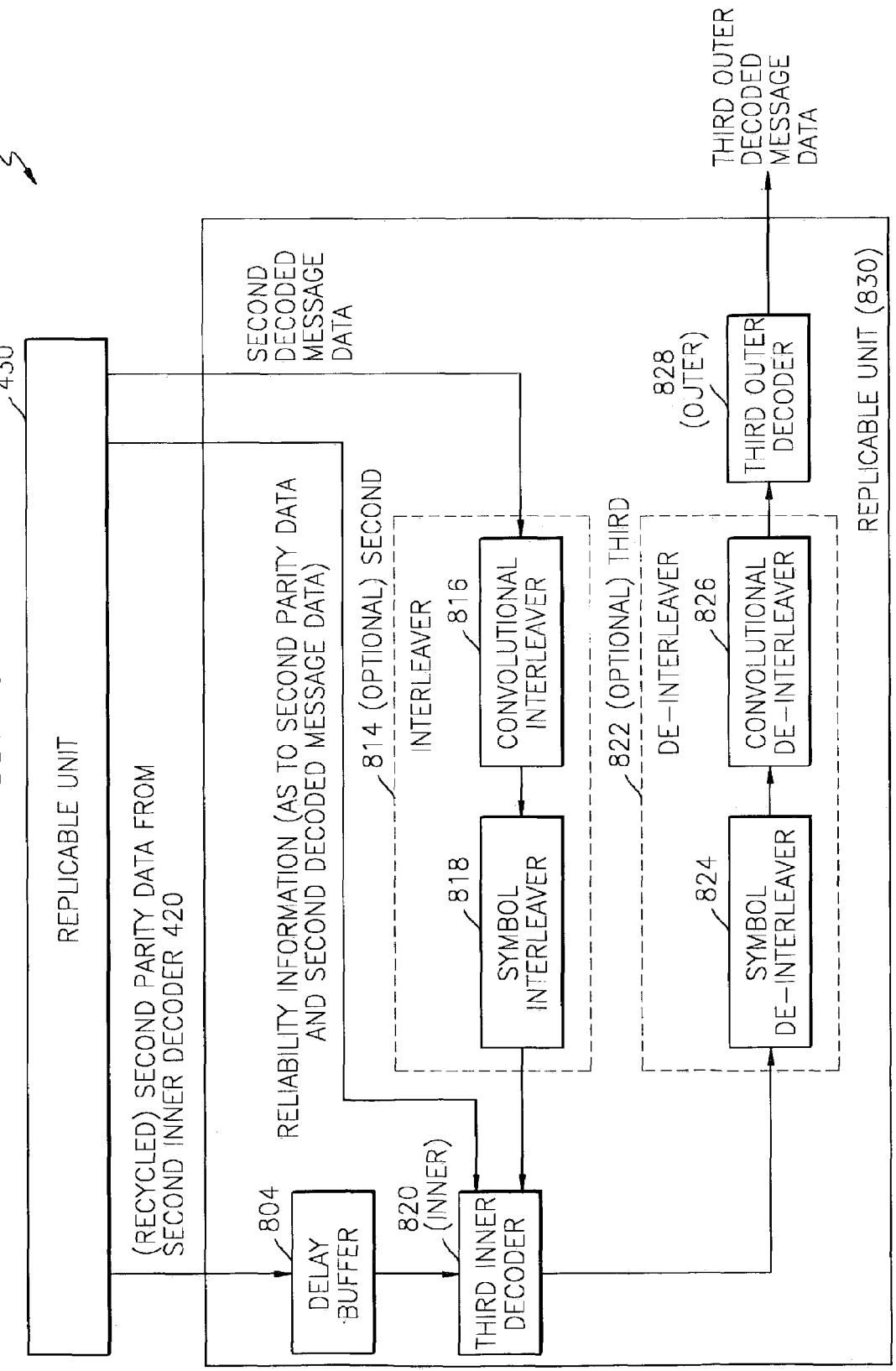
FIG. 8 is a block diagram of a pipelined iterative decoder of concatenated codes according to an embodiment of the invention.

The units 404 and 414–428 can be considered to be a unit 430 that can be replicated/piplelined until a desired coding gain and bit error rate (BER) are achieved. In other words, the unit 430 is a replicable unit 430. This is emphasized by FIG. 8, which depicts a block diagram of an iterative decoder 800 for decoding concatenated codes according to an embodiment of the invention. The decoder 800 includes the replicable unit 430 and a similar replicable unit 830. The replicable unit 830 includes: a delay unit 804; an optional second interleaver 814 (that itself can include a second convolutional interleaver 816 and a second symbol interleaver 818); a third inner, e.g., TCM, decoder 820; an optional third de-interleaver 822 (that itself can include a third symbol de-interleaver 824 and a third convolutional de-interleaver 826); and a third outer, e.g., R-S, decoder 828.

Figure 9A:
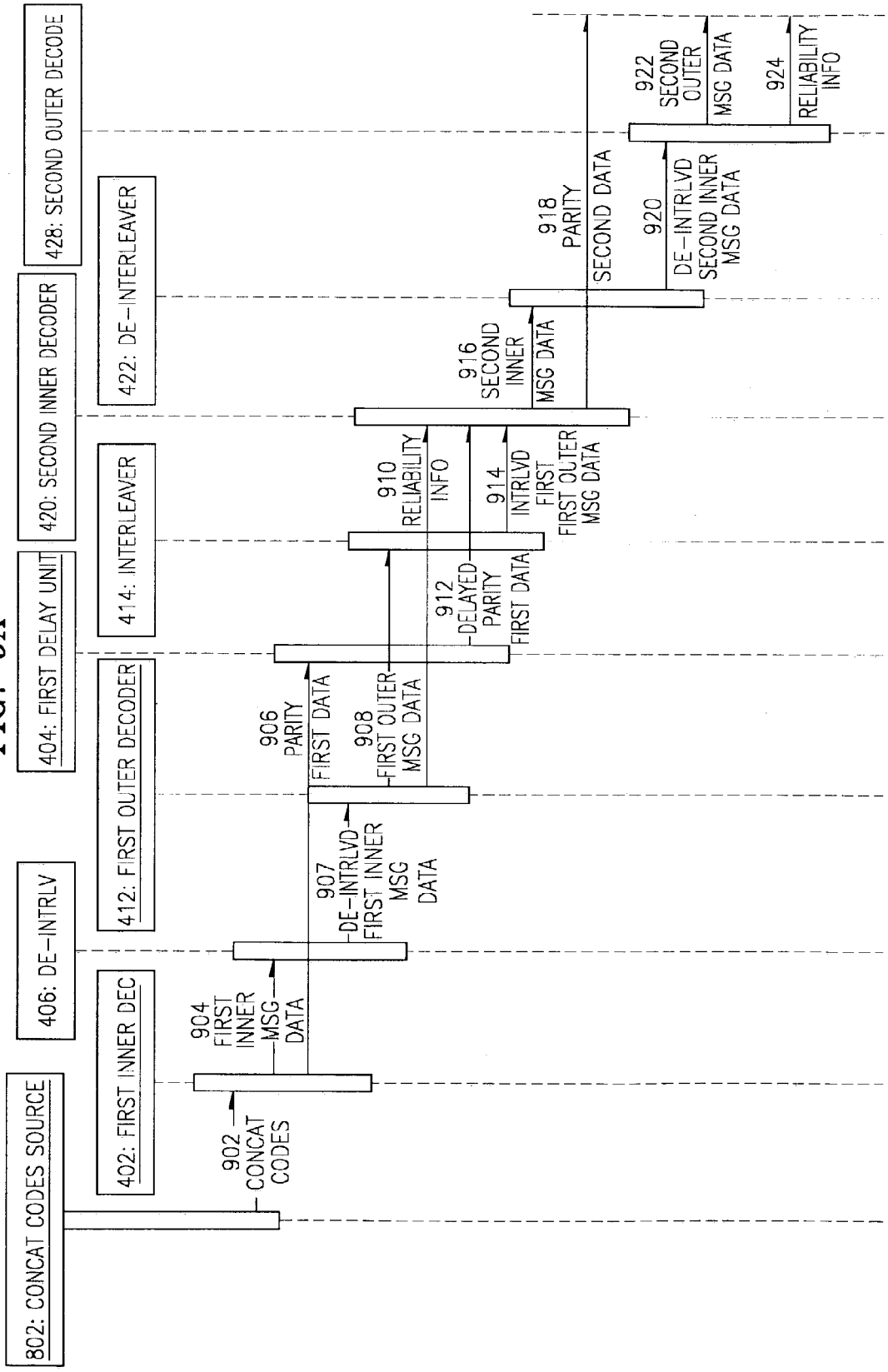
FIGS. 9A and 9B are unified modeling language (UML) sequence diagrams of concatenated code decoding actors and actions according to an embodiment of the invention.
Figure 9B:
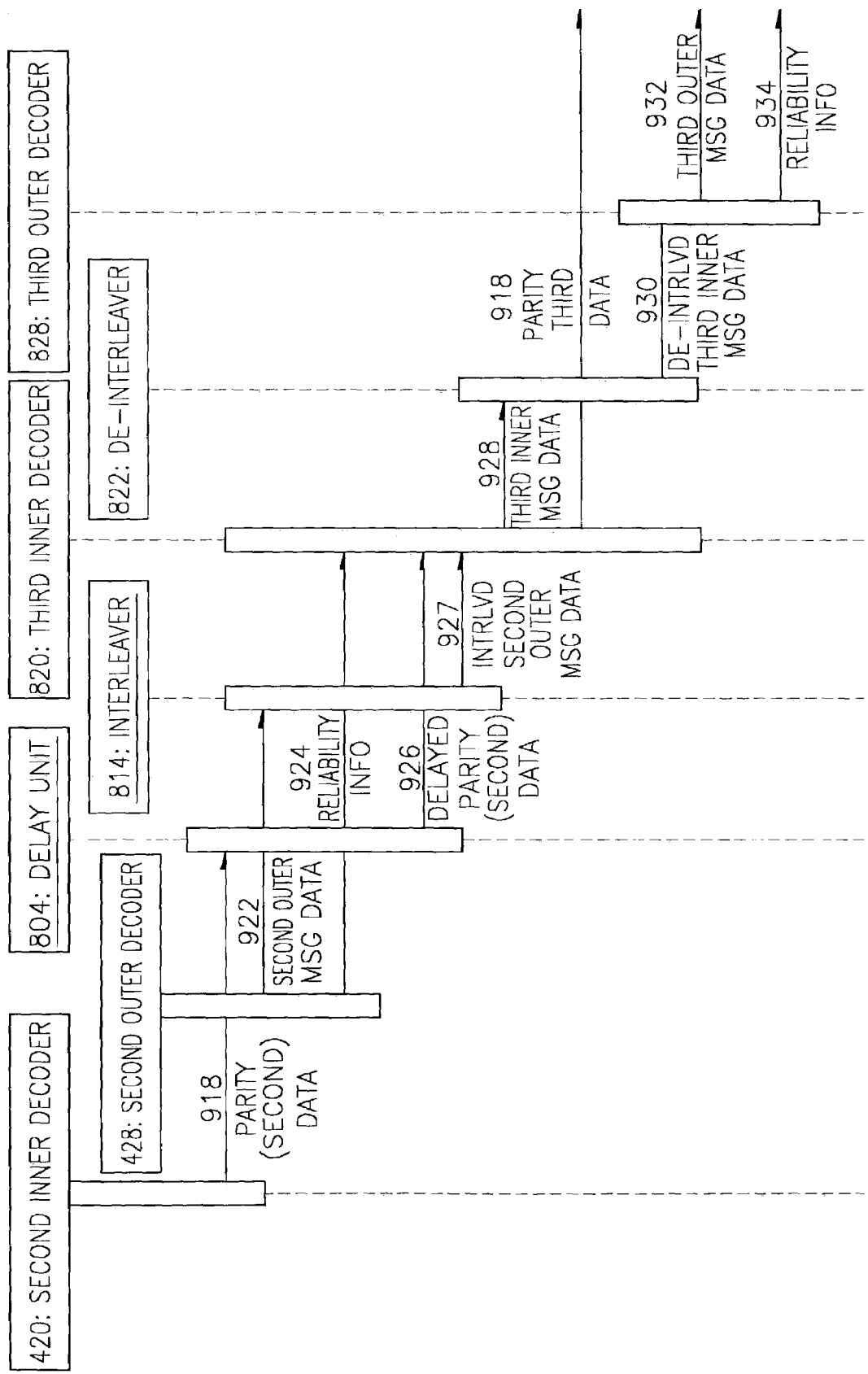

FIGS. 9A and 9B are UML sequence diagrams of concatenated code decoding actors and actions according to an embodiment of the invention. FIGS. 9A and 9B can be used to explain the operation of the iterative decoder of FIG. 8.

In FIG. 9A, concatenated codes are supplied from a source of such concatenated codes at action 902. An example of a source 802 can be a demodulator 112 that receives signals through a communications channel 110. The first inner decoder 402 receives the concatenated codes, decodes them and provides first inner message data to the optional first de-interleaver 406 at action 904. The first inner decoder 402 recycles the first parity data by providing it to the first delay unit 404 at action 906. The first de-interleaver 406 provides de-interleaved first inner message data to the first outer decoder 412 at action 907.

Alternatively, if the first de-interleaver 406 is not present because the concatenated codes are predetermined not to be interleaved, then the first inner message data can be provided directly to the first outer decoder 412 from the first inner decoder 402.

The first outer decoder 412 decodes the de-interleaved first inner message data, resulting in first outer message data, which is provided to the optional interleaver 414 at action 908. The first outer decoder 412 also generates reliability information and provides it to the second inner decoder 420 at action 910. The first delay unit 404 delays the first parity data and provides it to the second inner decoder 420 at action 912. The interleaver 414 interleaves the first outer message data and provides the interleaved first outer message data to the second inner decoder 420 at action 914.

Alternatively, the interleaver 414 can be omitted. In that case, the first outer message data can be provided directly to the second inner decoder 420 from the first outer decoder 412.

The second inner decoder 420 operates upon the reliability information and the first parity data while decoding the first outer message data, resulting in second inner message data, which the second inner decoder 420 provides to the optional second de-interleaver 422 at action 916. The second inner decoder 420 recycles the second parity data that it generates by providing the second parity data to the second delay unit 804 at action 918. The second de-interleaver 422 provides de-interleaved second inner message data to the second outer decoder 428 at action 920.

Alternatively, if the de-interleaver 422 is not present because the interleaver 414 is not present, then the second inner message data can be provided directly to the second outer decoder 428 from the second inner decoder 420.

The second outer decoder 428 decodes the de-interleaved second inner message data, resulting in second outer message data, which is provided to the optional second interleaver 814 at action 922. The second outer decoder 428 generates reliability information and provides it to the third inner decoder 820 at action 924. In FIG. 9B, the second delay unit 804 delays the second parity data and provides it to the third inner decoder 820 at action 926. The second interleaver 814 interleaves the second outer message data and provides the interleaved second outer message data to the third inner decoder 820 at action 927.

Alternatively, the interleaver 814 can be omitted. In that case, the second outer message data can be provided directly to the third inner decoder 820 from the second outer decoder 428.

The third inner decoder 820 operates upon the reliability information from the second outer decoder 428 and the second parity data from the second inner decoder 420 while decoding the second outer message data from the second outer decoder 428, resulting in third inner message data, which the third inner decoder 820 provides to the optional third de-interleaver 822 at action 928. The third inner decoder 820 recycles the parity data that it generates by outputting the third parity data to a third delay unit (not depicted) at action 918 if a third replicable unit (not depicted) were present. The third de-interleaver 822 provides de-interleaved third inner message data to the third outer decoder 828 at action 930.

The third outer decoder 828 decodes the de-interleaved third inner message data, resulting in third outer message data, which is outputted. If a third replicable unit (not depicted) were included, then the following actions would also be included. The third outer message data would be provided to an optional interleaver (not depicted) at action 932. Also, the third outer decoder 828 would generate reliability information and would provide it to a fourth inner decoder (not depicted) at action 934.

Figure 10:
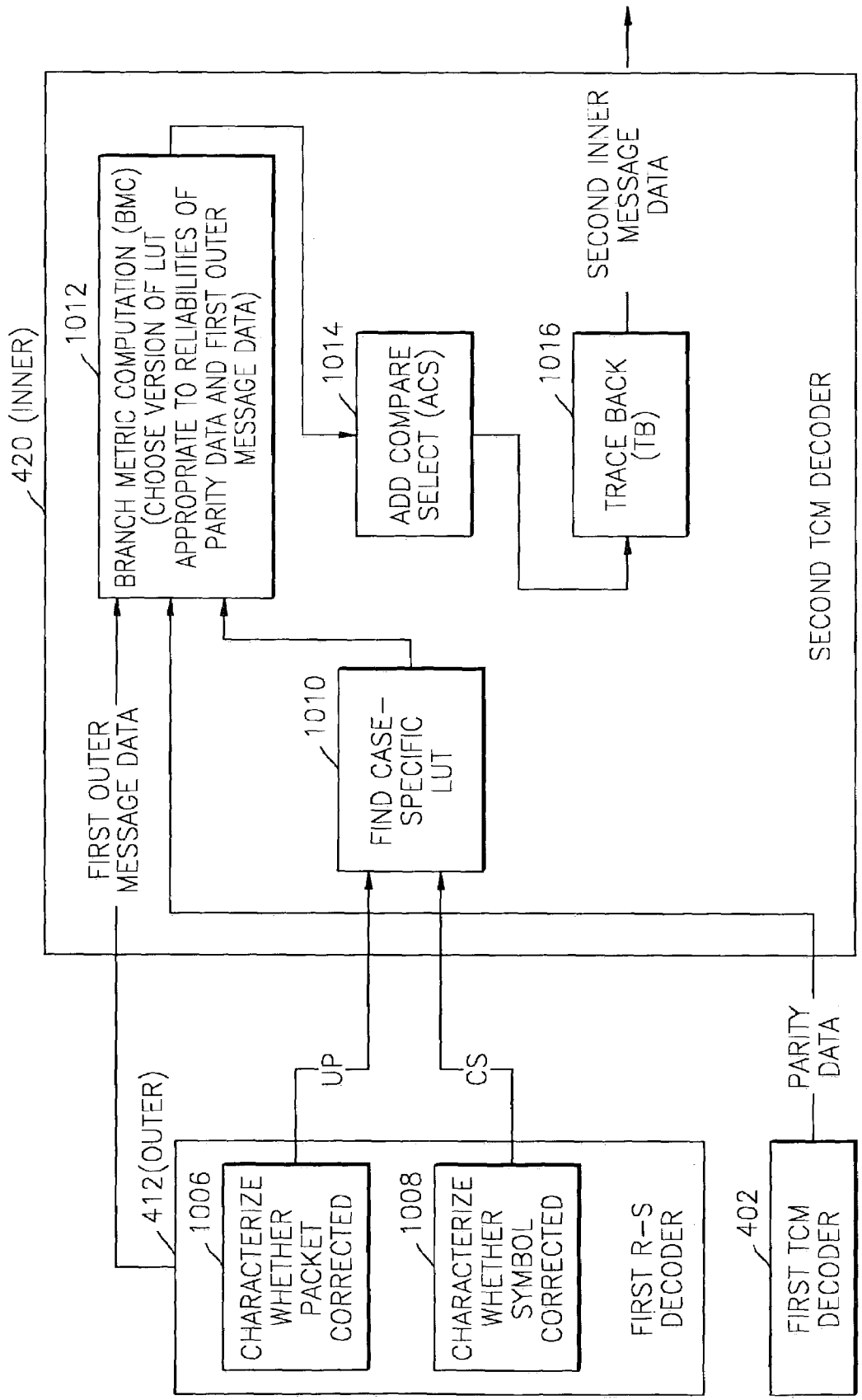
FIG. 10 is a more detailed block diagram of a second inner decoder according to an embodiment of the invention.

FIG. 10 is a more detailed block diagram of a second inner decoder, e.g., 420, according to an embodiment of the invention. An R-S decoder can have: a logic unit 1006 to assess whether the corresponding packet has a sufficiently small number of errors to be considered a correctable or uncorrectable packet, resulting in the UP output signal; and a logic unit 1008 to identify what bytes in a packet have been corrected (e.g., via generation of an error location polynomial), resulting in the CS signal.

The decoder 420 includes: a logic unit 1010 to select one LUT, from among multiple case-specific LUTs (see FIG. 7) of branch metric values, based upon the values of the UP signal and the CS signal (such as are shown in FIG. 5); a logic unit 1012 to index into the LUT selected by the logic unit 1010 in order to obtain branch metric values corresponding to four transmitted data pairs; an Add Compare Select (ACS) 1014; and a Trace Back (TB) unit 1016. The branch metric values obtained by the unit 1012 are added by the unit 1014 to the cumulative metric, the sums compared against each other, and the sum having the lowest magnitude selected. As the ACS unit 1014 and the TB unit 1016 are known, no further discussion is provided.

The inner and outer decoders have been discussed in terms of the inner decoders being TCM decoders and the outer decoders being R-S decoders. Other combination of inner and outer decoders can be used, e.g., a Viterbi decoder with a convolutional code as the inner decoder and an R-S decoder as the outer decoder, or an R-S decoder as both the inner and outer decoders.

The invention may be embodied in other forms without departing from its spirit and essential characteristics. The described embodiments are to be considered only non-limiting examples of the invention. The scope of the invention is to be measured by the appended claims. All changes which come within the meaning and equivalency of the claims are to be embraced within their scope.

What is claimed:

1. A method of decoding concatenated codes, the method comprising:

receiving data representing concatenated codes;
first inner decoding the received data resulting in first inner message data and parity data;
first outer decoding the first inner message data, resulting in reliability information and first outer message data;
second inner decoding the first outer message data, resulting in second inner message data, the second inner decoding being a function of
the reliability information from the first outer decoding,
the first outer message data, and
the parity data from the first inner decoding; and
second outer decoding the second inner message data.

2. The method of claim 1, wherein
the parity data is first parity data;
the second outer decoding results in second outer message data and reliability information, and
the second inner decoding also results in second parity data;
the method further comprising:
third inner decoding the second outer message data, resulting in third inner message data, the third inner decoding being a function of
the reliability information from the second outer decoding,
the second outer message data, and
the second parity data from the second inner decoding; and
third outer decoding the third inner message data.

3. The method of claim 2, further comprising:
de-interleaving the first inner message data, the first outer decoding being upon the de-interleaved first inner message data.

4. The method of claim 2, further comprising:
interleaving the first outer message data, the second inner decoding being operable upon the interleaved first outer message data; and
de-interleaving the second inner message data, the second outer decoding being operable upon the de-interleaved second inner message data.

5. The method of claim 2, further comprising:
first delaying the first parity data before the first parity data is operated upon by the second inner decoding; and
second delaying the second parity data before the second parity data is operated upon by the third inner decoding.

6. The method of claim 1, wherein the first inner decoding is one of a trellis-coded modulation (TCM) decoding, a Viterbi decoding and an Reed-Solomon decoding, and the first outer decoding is an Reed-Solomon decoding.

7. The method of claim 1, further comprising:
de-interleaving the first inner message data, the first outer decoding being operable upon the de-interleaved first inner message data.

8. The method of claim 1, further comprising:
interleaving the first outer message data, the second inner decoding being operable upon the interleaved first outer message data; and
de-interleaving the second inner message data, the second outer decoding being operable upon the de-interleaved second inner message data.

9. The method of claim 1, further comprising:
delaying the parity data before the parity data is operated upon by the second inner decoding.

10. The method of claim 1, wherein, for a received symbol, the second inner decoding determines appropriate branch metric values for all branches in a trellis representing the associated encodation based upon information about
whether a packet, of which the received symbol is a part, is uncorrectable, and
whether a byte, of which the received symbol is a part, has been corrected by the first outer decoding.

11. A code arrangement on a computer-readable medium, execution of said code arrangement by one or more processors causing concatenated codes to be decoded according to the method of claim 1.

12. An apparatus for decoding concatenated codes, the apparatus comprising:
a first inner decoder to receive and decode data representing concatenated codes, resulting in first inner message data and parity data;
a first outer decoder to decode the first inner message data, resulting in reliability information and first outer message data;
a second inner decoder to decode the first outer message data, resulting in second inner message data, the second inner decoder being operable to decode as a function of
the reliability information from the first outer decoder,
the first outer message data, and
the parity data from the first inner decoder; and
a second outer decoder to decode the second inner message data.

13. The apparatus of claim 12, wherein
the parity data is first parity data;
the second outer decoder produces second outer message data and reliability information,
the second inner decoder also produces second parity data; and
the apparatus further comprises:
a third inner decoder to decode the second outer message data, resulting in third inner message data, the third inner decoder being operable to decode as a function of
the reliability information from the second outer decoder,
the second outer message data, and
the second parity data from the second inner decoder; and
a third outer decoder to decode the third inner message data.

14. The apparatus of claim 13, further comprising:
a de-interleaver to de-interleave the first inner message data, the first outer decoder being operable upon the de-interleaved first inner message data.

15. The apparatus of claim 13, further comprising:
an interleaver to interleave the first outer message data, the second inner decoder being operable upon the interleaved first outer message data; and
a de-interleaver to de-interleave the second inner message data, the second outer decoder being operable upon the de-interleaved second inner message data.

16. The apparatus of claim 13, further comprising:
a first delay unit to delay the first parity data before the first parity data is operated upon by the second inner decoder; and
a second delay unit to delay the second parity data before the second, parity data is operated upon by the third inner decoder.

17. The apparatus of claim 12, wherein the first inner decoder is one of a trellis-coded modulation (TCM) decoder, a Viterbi decoder and an Reed-Solomon decoder, and the first outer decoder is an Reed-Solomon decoder.

18. The apparatus of claim 12, further comprising:
a de-interleaver to de-interleave the first inner message data, the first outer decoder being operable upon the de-interleaved first inner message data.

19. The apparatus of claim 12, further comprising:
an interleaver to interleave the first outer message data, the second inner decoder being operable upon the interleaved first outer message data; and
a de-interleaver to de-interleave the second inner message data, the second outer decoder being operable upon the de-interleaved second inner message data.

20. The apparatus of claim 12, further comprising:
a delay unit to delay the parity data before the parity data is operated upon by the second inner decoder.

21. The apparatus of claim 12, wherein, for a received symbol, the second inner decoder is operable to determine appropriate branch metric values for all branches in a trellis representing the associated encoding based upon information about
whether a packet, of which the received symbol is a part, is uncorrectable, and
whether a byte, of which the received symbol is a part, has been corrected by the first outer decoder.

22. An apparatus for decoding concatenated codes, the apparatus comprising:
first inner means for receiving and decoding data representing concatenated codes, resulting in first inner message data and parity data;
first outer means for decoding the first inner message data, resulting in reliability information and first outer message data;
second inner means for decoding the first outer message data, resulting in second inner message data, the second inner means being operable as a function of
the reliability information from the first outer means,
the first outer message data, and
the parity data from the first inner means; and
second outer means for decoding the second inner message data.

* * * * *